US012051574B2

(12) United States Patent
Kobayashi et al.

(10) Patent No.: US 12,051,574 B2
(45) Date of Patent: Jul. 30, 2024

(54) WAFER PROCESSING METHOD AND PLASMA PROCESSING APPARATUS

(71) Applicant: Hitachi High-Tech Corporation, Tokyo (JP)

(72) Inventors: Hiroyuki Kobayashi, Tokyo (JP); Atsushi Sekiguchi, Tokyo (JP); Tatehito Usui, Tokyo (JP); Soichiro Eto, Tokyo (JP); Shigeru Nakamoto, Tokyo (JP); Kazunori Shinoda, Tokyo (JP); Nobuya Miyoshi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/978,911

(22) PCT Filed: Dec. 20, 2019

(86) PCT No.: PCT/JP2019/050013
§ 371 (c)(1),
(2) Date: Sep. 8, 2020

(87) PCT Pub. No.: WO2021/124539
PCT Pub. Date: Jun. 24, 2021

(65) Prior Publication Data
US 2023/0118576 A1    Apr. 20, 2023

(51) Int. Cl.
*H01J 37/32* (2006.01)
*H01L 21/66* (2006.01)

(52) U.S. Cl.
CPC .... *H01J 37/32963* (2013.01); *H01J 37/3244* (2013.01); *H01J 37/32651* (2013.01);
(Continued)

(58) Field of Classification Search
CPC ............. H01J 37/32972; H01J 37/3244; H01J 37/32651; H01J 37/32; H01J 37/32963;
(Continued)

(56) References Cited

U.S. PATENT DOCUMENTS

| 3,562,677 A | 2/1971 | Gunderson |
| 5,728,253 A | 3/1998 | Saito et al. |

(Continued)

FOREIGN PATENT DOCUMENTS

| DE | 102006009460 A1 | 9/2007 |
| JP | 2000208524 A | 7/2000 |

(Continued)

OTHER PUBLICATIONS

Office Action mailed Dec. 19, 2022 in U.S. Appl. No. 16/913,010.
(Continued)

*Primary Examiner* — Yuechuan Yu
(74) *Attorney, Agent, or Firm* — Miles & Stockbridge, P.C.

(57) ABSTRACT

This invention provides a wafer processing method comprising a process of irradiating a wafer to be processed placed on the upper surface of a sample table arranged in a processing chamber with light or electromagnetic waves to heat and remove a compound layer of a film layer that is preliminarily formed on the upper surface of the film layer of the upper surface of the wafer, wherein in the process, by receiving the light or electromagnetic waves reflected by the upper surface of the wafer, a signal indicating a temporal change in intensity using the wavelength of the light or electromagnetic waves as a parameter is corrected using information of the intensity of the light or electromagnetic waves detected by receiving the light or electromagnetic waves at a position on the circumferential side of the upper surface of the sample table.

4 Claims, 9 Drawing Sheets

(52) U.S. Cl.
CPC .... *H01L 22/26* (2013.01); *H01J 2237/24507* (2013.01); *H01J 2237/334* (2013.01)

(58) Field of Classification Search
CPC ....... H01J 37/32935; H01J 2237/24507; H01J 2237/334; H01L 21/67; H01L 21/3065; H01L 22/26; H01L 22/12
See application file for complete search history.

(56) References Cited

U.S. PATENT DOCUMENTS

| | | | |
|---|---|---|---|
| 6,390,019 B1* | 5/2002 | Grimbergen | H01J 37/32623 156/345.46 |
| 7,582,491 B2 | 9/2009 | Sasaki et al. | |
| 9,070,725 B2 | 6/2015 | Matsudo et al. | |
| 2002/0048019 A1 | 4/2002 | Sui et al. | |
| 2004/0185670 A1 | 9/2004 | Hamelin et al. | |
| 2008/0093315 A1 | 4/2008 | Okabe | |
| 2008/0102001 A1 | 5/2008 | Chandrachood et al. | |
| 2008/0268645 A1 | 10/2008 | Kao et al. | |
| 2010/0206482 A1* | 8/2010 | Matsudo | G01J 5/0003 118/712 |
| 2012/0064247 A1 | 3/2012 | Hiwa et al. | |
| 2013/0343426 A1 | 12/2013 | Gurary et al. | |
| 2014/0251945 A1 | 9/2014 | Nishimura et al. | |
| 2015/0118858 A1 | 4/2015 | Takaba | |
| 2015/0270140 A1 | 9/2015 | Gupta et al. | |
| 2015/0270148 A1 | 9/2015 | Shinoda et al. | |
| 2017/0125261 A1 | 5/2017 | Miyama et al. | |
| 2017/0133233 A1 | 5/2017 | Sato et al. | |
| 2017/0229290 A1* | 8/2017 | Kobayashi | H01L 21/6719 |
| 2018/0090345 A1 | 3/2018 | Kouzuma et al. | |
| 2018/0122665 A1* | 5/2018 | Kobayashi | H01J 37/32972 |
| 2018/0197748 A1 | 7/2018 | Nishimura et al. | |
| 2019/0028725 A1 | 1/2019 | Zhang et al. | |
| 2019/0287825 A1 | 9/2019 | Tanaka | |
| 2020/0328099 A1 | 10/2020 | Kobayashi et al. | |

FOREIGN PATENT DOCUMENTS

| | | |
|---|---|---|
| JP | 2003347278 A | 12/2003 |
| JP | 2004518272 A | 6/2004 |
| JP | 2007234859 A | 9/2007 |
| JP | 2007-263583 A | 10/2007 |
| JP | 2014170894 A | 9/2014 |
| JP | 2015012243 A | 1/2015 |
| JP | 2015522953 A | 8/2015 |
| JP | 2015185594 A | 10/2015 |
| JP | 2016178257 A | 10/2016 |
| JP | 2017084965 A | 5/2017 |
| JP | 2017092116 A | 5/2017 |
| JP | 2017143186 A | 8/2017 |
| JP | 2018056248 A | 4/2018 |
| JP | 2018073962 A | 5/2018 |
| JP | 2018107202 A | 7/2018 |
| JP | 2018110229 A | 7/2018 |
| JP | 2018110230 A | 7/2018 |
| JP | 2018113306 A | 7/2018 |
| JP | 2019161157 A | 9/2019 |
| WO | 2010008721 A2 | 1/2010 |
| WO | 2013168509 A1 | 11/2013 |

OTHER PUBLICATIONS

Final Office Action mailed Mar. 14, 2022 in U.S. Appl. No. 16/495,515.
Non-Final Office Action Mailed Jul. 21, 2022 in U.S. Appl. No. 16/913,010.
Search Report mailed Apr. 23, 2019 in International Application No. PCT/JP2019/003601.
Office Action mailed Oct. 27, 2020 in Japanese Application No. 2019-546055.
Non Final Office Action mailed Sep. 29, 2021 in U.S. Appl. No. 16/495,515.
Search Report mailed Apr. 7, 2020 in International Application No. PCT/JP2019/050013.
Notice of Allowance mailed Oct. 18, 2023 in U.S. Appl. No. 16/913,010.

* cited by examiner

WAFER PROCESSING METHOD AND PLASMA PROCESSING APPARATUS

TECHNICAL FIELD

The present invention relates to a plasma processing apparatus and a wafer processing method for processing a film to be processed on a surface of a wafer arranged in a processing chamber inside a vacuum container using plasma, and particularly to a plasma processing apparatus and a wafer processing method for detecting the amount of an etching process of a film performed by heating using irradiation of plasma and irradiation of electromagnetic waves onto the film to be processed.

BACKGROUND ART

In response to a request for low power consumption and an increase in storage capacity of a semiconductor device, and further miniaturization and development of a three-dimensional device structure have been advanced. In manufacturing of a device having a three-dimensional structure, since the structure is stereoscopic and complicated, application of not only conventional "vertical etching" in which etching is performed in the direction vertical to the planar direction of a surface of a semiconductor wafer to be processed but also "isotropic etching" in which etching can be also performed in the horizontal direction has been considered.

Such isotropic etching has been performed from the past by a wet process in which a film layer on a surface of a semiconductor wafer is processed using chemicals or the like. However, with the development of the miniaturization of the structure of the semiconductor device, problems such as a pattern collapse due to the surface tension of chemicals and control of a machining dimension have arisen. Therefore, the necessity of performing the isotropic etching by a dry process without using chemicals from the conventional wet process using chemicals has been increased.

On the other hand, as one of techniques of performing isotropic etching by a dry process with high accuracy, etching using absorption and desorption processes has been known from the past. As an example of such a technique, in Japanese Unexamined Patent Application Publication No. 2015-185594 (Patent Literature 1), an active species (radical) having highly-reactive atoms or molecules generated by using plasma is first absorbed on a surface of a film layer to be processed of a semiconductor wafer that is a material to be processed, and a reaction layer (or an altered layer) made of compounds formed by a chemical reaction between the active species and the material of the surface of the film layer is formed (absorption process). Next, heat energy is applied to heat the reaction layer, and the reaction layer is desorbed and removed (desorption process). The target film is etched by alternately repeating the absorption process and the desorption process.

In this conventional technique, when the reaction layer formed on the surface in the absorption process reaches a predetermined thickness, the reaction layer blocks the radical from reaching the film layer to be processed. Thus, the speed of an increase in the thickness of the reaction layer is rapidly reduced, and the thickness becomes closer to a thickness in accordance with conditions. Therefore, even if the incident amount of radical varies in a complicated pattern shape, the reaction layer with small variation in thickness in the planar direction of the wafer can be formed by performing the absorption process for a sufficiently long time. In addition, a process with small variation in the etching amount can be realized without depending on the pattern shape by heating and removing such a reaction layer.

In addition, the etching amount per one cycle including such one pair of the absorption process and the desorption process is usually about several nm or smaller, and thus the depth (machining amount) of machining can be advantageously adjusted with accuracy of several nm. Further, the radical species necessary for forming the reaction layer on the surface of the film layer to be processed is made different from the radical species that etches a film that is not to be processed, and etching with the selection ratio of both increased can be realized.

Further, as a plasma processing apparatus in which a wafer is etched using plasma, a conventional technique in which an apparatus for measuring the remaining film thickness and the etching amount during a process of a film to be processed on the wafer is mounted has been known. As an example of such a conventional technique, for example, Japanese Unexamined Patent Application Publication No. 2007-234859 (Patent Literature 2) discloses a technique in which light from an external light source is irradiated onto a surface of a wafer from above a processing chamber during a process of the wafer held on the upper surface of a sample table arranged in the processing chamber inside a vacuum container, interference light formed by being reflected by the surface of the wafer is received above the processing chamber, and a pattern of the intensity of light having an arbitrary wavelength obtained from the received interference light is compared with data of a pattern using plural wavelengths of the intensity of interference light with respect to the preliminarily-obtained remaining film thickness as parameters to determine the remaining film thickness.

CITATION LIST

Patent Literature

Patent Literature 1: Japanese Unexamined Patent Application Publication No. 2015-185594
Patent Literature 2: Japanese Unexamined Patent Application Publication No. 2007-234859

SUMMARY OF INVENTION

Technical Problem

In the above-described conventional techniques, since consideration of the following points has been insufficient, problems have arisen.

Namely, in the technique of Patent Literature 1, detection of the remaining film thickness during the process of the wafer is not considered at all. In addition, as disclosed in Patent Literature 2, as an apparatus in which a wafer is etched using plasma, an apparatus including a configuration of measuring the film thickness of a film to be processed on the wafer has been known. However, even if such a technique is to be applied to Patent Literature 1 and an IR lamp unit is to be mounted above a lamp window configuring the ceiling surface of a processing chamber in which the wafer of Patent Literature 1 is arranged, the circumferential part of the wafer falls within a projection region under the IR lamp unit with the position fixed to efficiently heat the wafer when viewed from the top plate at an upper part.

In such a configuration, it has been difficult to arrange a light-reception unit by securing an optical path so that after reference light permeating the window member from above the lamp unit or the window member to be irradiated onto the surface of the wafer is reflected, the light is received again to be able to determine the remaining film thickness with high accuracy. In addition, even in the case where the remaining film thickness at a center part of the wafer is to be detected, a gas introduction unit arranged at the top plate at an upper part of a plasma formation chamber and an ion shielding plate above a middle part of the wafer in a passage for radical between the plasma formation chamber and the processing chamber under the gas introduction unit are arranged in the configuration of Patent Literature 1, and there has been a possibility that the intensity of light is deteriorated on the route of light from the surface of the wafer.

Therefore, the problem that the accuracy of the detection of the remaining film thickness is deteriorated, variations in the shape of the result of the process are increased, and the yield of the process of the wafer is deteriorated has not been considered in the conventional techniques. An object of the present invention is to provide a plasma processing apparatus and a wafer processing method in which the accuracy of detecting the remaining film thickness is enhanced to improve the yield of a process.

Solution to Problem

Embodiments can comprise a plasma processing apparatus including a processing chamber provided inside a vacuum container; a sample table which is arranged in the processing chamber and which has an upper surface for holding a wafer to be processed; a plasma formation chamber which is arranged above the processing chamber inside the vacuum container and in which plasma is formed using a gas supplied therein; an introduction passage which communicates the plasma formation chamber with the processing chamber, inside of which reactive particles in the plasma pass through to be introduced to an inside of the processing chamber, and which has a lower opening above the upper surface of the sample table; a heater which is arranged on a circumferential region of the introduction passage surrounding the introduction passage above the processing chamber, and which irradiates the wafer with light or electromagnetic waves for a heating step of the wafer processing; an introduction plate which is arranged inside the introduction passage, and which has a plurality of through-holes through which the reactive particles pass in a circumferential portion of the introduction plate, and which has a middle portion surrounded by the circumferential portion with through-holes constituted by a material which the light or electromagnetic waves permeate; and a first detector which is arranged at an upper part of the plasma formation chamber and which detects a change in intensity of the light or electromagnetic waves which are emitted from the heater and are reflected by the wafer and permeate the middle portion of the introduction plate during the heating step of the wafer processing.

Advantageous Effects of Invention

According to the present invention, it is possible to provide a plasma processing apparatus and a wafer processing method in which the yield of a process is improved.

DESCRIPTION OF EMBODIMENTS

Hereinafter, an embodiment of the present invention will be described in detail on the basis of the drawings.

First Embodiment

Hereinafter, an embodiment of the present invention will be described using FIG. 1 to FIG. 9.

Figure 1:
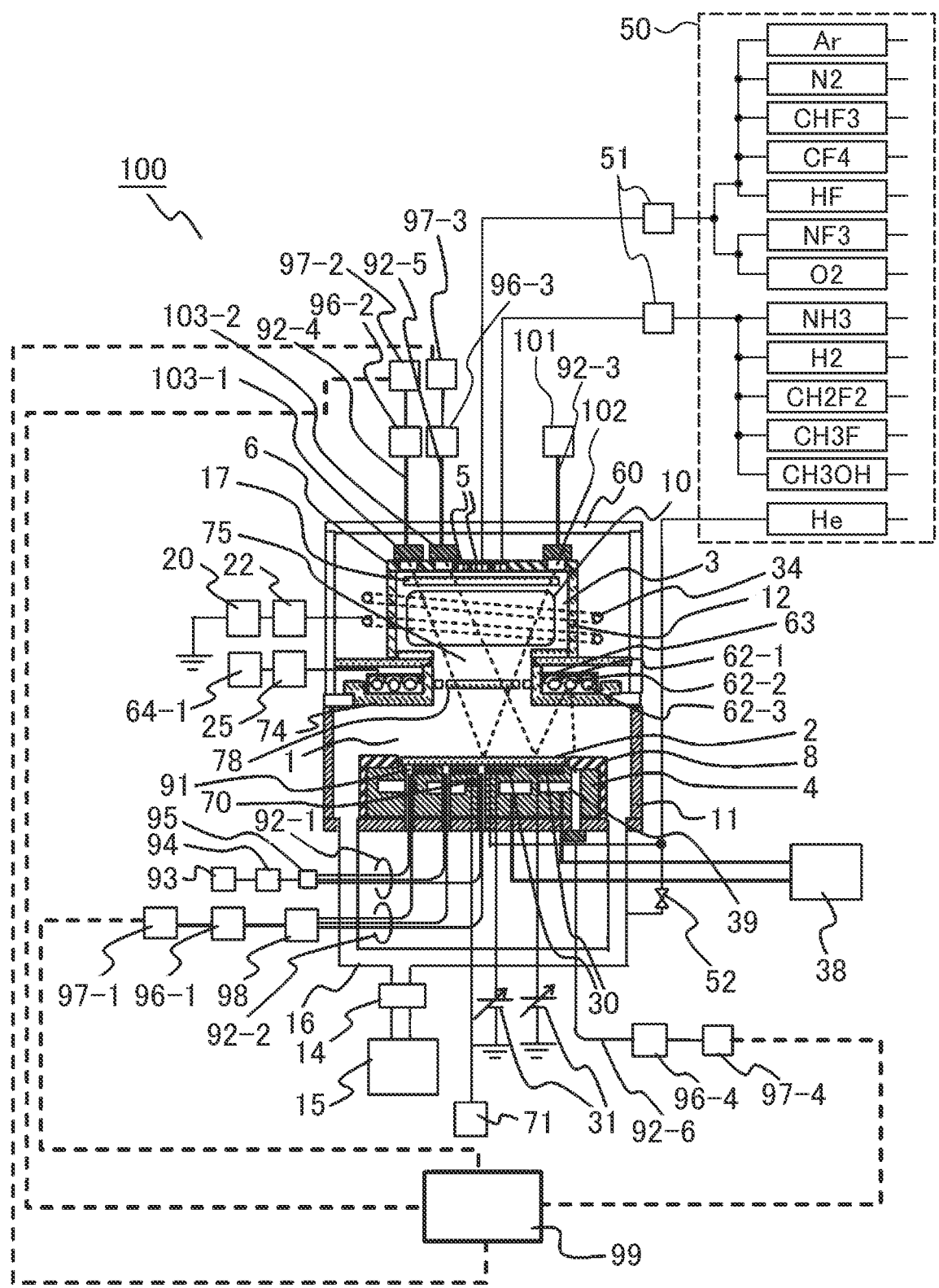
FIG. 1 is a vertical cross-sectional view for schematically showing an outline of a configuration of a plasma processing apparatus according to an embodiment of the present invention.

FIG. 1 is a vertical cross-sectional view for schematically showing an outline of a configuration of a plasma processing apparatus according to the embodiment of the present invention. The plasma processing apparatus of the embodiment includes a vacuum container and a lamp that irradiates and heats a wafer on a stage in a processing chamber arranged at a lower part of the vacuum container with infrared rays (IR), and is a wafer processing apparatus that includes a discharge chamber configuring an upper part of the vacuum container to form plasma therein, a passage communicating the discharge chamber with the processing chamber therebelow, and a slit arranged inside the passage and having plural gaps or holes through which particles of an active species such as radical having high reactivity generated by forming plasma pass.

In a plasma processing apparatus 100 of the example, a processing unit in which a sample to be processed arranged therein is processed is arranged at a lower part of the vacuum container, and a discharge unit in which plasma is formed to process the sample is arranged at an upper part of the vacuum container located thereabove. Namely, a processing chamber 1 that is a chamber having a cylindrical shape is arranged inside a base chamber 11 configuring the processing unit located at a lower part of the vacuum container. A wafer stage 4 on the circular upper surface of which a wafer 2 is placed and which has a cylindrical shape is arranged at a lower part inside the processing chamber 1.

Further, a quartz chamber 12 having a cylindrical shape is arranged in the discharge unit located at an upper part of the vacuum container above the base chamber 11, and a discharge chamber 3 having a cylindrical shape in which plasma 10 is formed as a plasma source is arranged inside the quartz chamber 12. Further, between the discharge chamber 3 and the processing chamber 1, arranged is a radical flow channel 75 that communicates the discharge chamber 3 with the processing chamber 1 and is a passage having a cylindrical shape through which the active species (radical) of the plasma 10 formed in the discharge chamber 3 is introduced to the processing chamber 1.

On the outer side of the circumferential side wall of the cylindrical shape of the quartz chamber 12, arranged is an ICP coil 34 that is wound plural times in the vertical direction along the side wall by leaving gaps from the side wall and to which high frequency power is supplied. The plasma 10 is formed in such a manner that ICP (Inductively Coupled Plasma) discharge is used and atoms or molecules of a gas for processing introduced to the inside of the discharge chamber 3 therein are dissociated or ionized by being excited by an induced magnetic field caused by high frequency power.

A high-frequency power supply 20 for generating plasma is connected to the ICP coil 34 through a matching device 22. As the frequency of the high frequency power in the embodiment, a frequency band of several tens of MHz such as 13.56 MHz is used.

A top plate 6 having a circular shape is placed above an upper end of the quartz chamber 12 having a cylindrical shape while sandwiching a seal member such as an O-ring between the lower surface of the circumferential part of the top plate 6 and the upper surface of the upper end of the quartz chamber 12. In a state where the inside of the vacuum container including the quartz chamber 12 configuring the vacuum container is decompressed, the discharge chamber 3 therein and the outside are tightly sealed by the seal member.

Further, an upper part of the vacuum container having the top plate 6 and the quartz chamber 12 of the example is coupled to a mass flow controller 50 in which a valve and a flow rate regulator are arranged on each of plural pipes for gas types. The flow rate or the velocity of the gas of each type flowing in each pipe is adjusted by the flow rate regulator. Then, the plural pipes are coupled to one pipe, and the one pipe is coupled to the top plate 6, so that the gases of various types join in the one pipe and are supplied to the inside of the discharge chamber 3 through through-holes formed in shower plates 5 as a gas for processing having a predetermined composition.

In the example, such shower plates 5 of the top plate 6 are arranged at a middle part of the discharge chamber 3 and a circumferential part surrounding the middle part in a ring shape, and a gas distributor 51 is arranged on each of the pipes each of which is individually coupled to each of the shower plates 5. The flow rates and the compositions of the gas supplied around the center of the discharge chamber 3 and the gas supplied around the circumference are independently adjusted and supplied. Accordingly, the distribution of radical formed in the discharge chamber 3 can be desirably adjusted. It should be noted that NH3, H2, CH2F2, CH3F, CH3OH, O2, NF3, Ar, N2, CHF3, CF4, and H2O are described in FIG. 1 as processing gases. However, other gases may be used.

A gas dispersion plate 17 and the shower plates 5 are arranged at an upper part in the discharge chamber 3 below the top plate 6 and the shower plates 5. The gas dispersion plate 17 is a circular plate member arranged so that the center thereof matches the central axis of the discharge chamber 3 in the vertical direction, and the circumferential edge thereof is located on the circumferential side with respect to the shower plates 5 when viewed from the lower side to the upper side. The processing gas introduced from the shower plates 5 to the inside of the discharge chamber 3 diffuses in a gap between the shower plates 5 or the top plate 6 and the gas dispersion plate 17, and is introduced to the inside of the discharge chamber 3 from the upper side through a gap between the circumferential edge part of the gas dispersion plate 17 and the top plate 6.

An exhaust pump 15 for exhausting and decompressing the insides of the processing chamber 1 and the discharge chamber 3 is connected below the bottom surface of the base chamber 11 through a vacuum exhaust pipe 16. For example, a turbo molecule pump, a mechanical booster pump, or a dry pump is used for the exhaust pump 15 of the embodiment, and an upper end of the vacuum exhaust pipe 16 is communicated with the inside of the processing chamber 1 through an exhaust port that is an opening of a through-hole penetrating a bottom part of the base chamber 11. On the vacuum exhaust pipe 16, provided is a regulating valve 14 that adjusts the pressure of the processing chamber 1 and the discharge chamber 3 to a value within a desired range by adjusting the flow rate at which particles inside the vacuum container are exhausted by the exhaust pump 15.

Further, an IR lamp unit for irradiating and heating the wafer 2 with infrared ray (Infrared Ray: IR) light is arranged between the stage 4 and the discharge chamber 3 above the processing chamber 1 of the plasma processing apparatus 100 of the embodiment. The IR lamp unit includes plural IR lamps 62 that are concentrically arranged around the central axis of the processing chamber 1, a reflective plate 63 that reflects the IR light generated by the IR lamps 62 to be directed toward the processing chamber 1, and an IR light transmission window 74 that is arranged under the IR lamps 62 and the reflective plate 63 and above the processing chamber 1, configures the ceiling surface of the processing chamber, and is configured using a ring-like member which the IR light permeates.

Triple circle-type (circular shape-like) lamps 62-1, 62-2, and 62-3 that are concentrically arranged at three positions on the central side, in the middle, and on the circumferential side in the radial direction are used for the IR lamps 62 of the example. It should be noted that light radiated from the IR lamps 62 is light (here, referred to as IR light) mainly composed of light in a range from visible light and infrared light.

In the embodiment, the triple circular shape-like lamps are arranged. However, the number of lamps in the radial direction is not limited to three. The reflective plate 63 that reflects the IR light radiated from each lamp toward the lower side (wafer arrangement direction) and the center side is arranged above each of the IR lamps 62-1, 62-2, and 62-3.

A power supply for a lamp 64-3 is connected to each of the IR lamps 62-1, 62-2, and 62-3, and only the power supply for a lamp 64-3 for the IR lamp 62-3 on the circumferential side is shown in the drawing. A high-frequency cut filter (low-pass filter) 25 for suppressing high frequency power for generating the plasma 10 from flowing into the power supply as noise is provided between each power supply and each IR lamp. Each power supply for a lamp can independently adjust the magnitude of the power supplied to each of the IR lamps 62-1, 62-2, and 62-3 and the amount of radiation of each lamp, and can adjust the distribution of degrees of heating the wafer 2 in the radial direction of the wafer 2.

The IR light transmission window 74 has a part having a flat ring shape configuring the ceiling surface of the processing chamber 1 and a part in a cylindrical shape arranged above the inner circumferential edge of the ring-like part, and at least the ring-like part and the part in a cylindrical shape configure the radical flow channel 75. Inside the radical flow channel 75, arranged is an ion shielding plate 78 in a disk shape that has plural through-holes or slits arranged in a ring-like region around the center for shielding charged particles such as ions and electrons generated in the plasma 10 and allowing a neutral gas or radical to permeate to be irradiated on the wafer 2 and is configured using a member such as quartz for allowing the IR light to permeate. The center of the radical flow channel 75 in the vertical direction is arranged to match the central axis of the stage 4 in the processing chamber 1 or the surface on which the wafer is placed, and radical introduced through the through-holes of the ion shielding plate 78 is reduced in variation of adhesion to the surface of the wafer 2 located below in the circumferential direction.

The stage 4 of the embodiment has a base material made of conductor such as metal having a disk or cylindrical shape therein, a coating film made of resin such as polyimide arranged by covering above the upper surface thereof, and a susceptor ring 8 that is arranged above the base material and the coating film made of resin around the surface on which the wafer 2 in a circular shape located at the middle part of the upper surface of the base material is placed and is a ring-like member made of ceramics such as quart. Further, inside the base material of the stage 4, provided is a flow channel 39 that is coupled to a chiller 38 and in which a refrigerant having a predetermined temperature adjusted by the chiller 38 flows and circulates, and the stage 4 is cooled by heat exchange between the refrigerant and the base material. In addition, in a dielectric film configuring the surface (mounting surface) on which the wafer 2 is placed, film-like electrostatic absorption electrodes 30 for absorbing and holding the wafer 2 using electrostatic force are arranged in the center part of the stage 4 and a region of the circumferential side therearound, and a DC power supply 31 is connected to each electrostatic absorption electrode.

In addition, in order to facilitate heat transmission between the wafer 2 and the mounting surface of the stage 4, at least one opening for introducing a He gas is arranged on the upper surface of the coating film configuring the mounting surface. In order to supply a He gas between the rear surface of the wafer 2 and the stage 4 in a state where the wafer 2 is electrostatically absorbed on the dielectric film, a pipe for He gas arranged inside the opening and the mass flow controller 50 is coupled to a pipe different from the pipe connected to the shower plate 5 through a penetration passage penetrating the base material of the stage 4 and the dielectric film. The pipe different from the pipe connected to the shower plate 5 is coupled to the vacuum exhaust pipe 16 through a valve 52 so that a He gas is exhausted to the vacuum exhaust pipe 16 in a state where no wafer 2 is placed on the stage 4.

In addition, in order to prevent the rear surface of the wafer 2 from being scratched even when the wafer 2 is heated or cooled while being absorbed, the mounting surface is configured using a coating film made of resin such as polyimide. In addition, a thermocouple 70 for measuring the temperature of the stage is arranged inside the stage 4, and the thermocouple is connected to a thermocouple thermometer 71.

In addition, at least one attachment hole 91 in which an optical fiber 92 for measuring the temperature of the wafer 2 by penetrating the base material and the coating film is arranged is arranged in the stage 4. In the example, the attachment holes 91 are arranged at three positions of the center part, the wafer circumferential part surrounding the center part, and the middle part in the radial direction that is the intermediate position therebetween, which are three positions different from each other in the radial direction of the wafer 2 of the stage 4.

An optical fiber 92-1 that is coupled to an external IR light source 93 arranged outside the processing chamber 1 and transmits the IR light from the external IR light source 93 to be irradiated on the rear surface of the wafer 2 from a tip end or an optical fiber 92-2 that receives the IR light permeating the wafer 2 or reflected from the wafer 2 to be transmitted to a spectroscope is arranged in each of the attachment holes 91.

External IR light radiated from the external IR light source 93 is transmitted to an optical path switch 94 for turning on or off an optical path through the optical fiber. Further, the external IR light is branched into plural after being transmitted to an optical distributor 95, and then is irradiated on the rear surface side of the wafer 2 from a tip end through the optical fiber 92-1.

The IR light absorbed by and reflected from the wafer 2 and radiated from the rear surface of the wafer 2 is transmitted to a spectroscope 96-1 after passing through the inside of the fiber 92-2 from a tip end to be separated for each of predetermined plural wavelengths, and then is transmitted to a detector 97 so that data indicating the intensity of spectrum of each wavelength is detected. In addition, an optical multiplexer 98 is arranged between three optical fibers 92-2 arranged in the three attachment holes 91 and the spectroscope 96-1, and any one of light beams of the optical fibers 92-2 received at the center part, the middle part, and the circumferential part is switched in accordance with a command signal from a control apparatus (not shown) to be transmitted to the spectroscope by the optical multiplexer 98. Using the wavelength dependency of the intensity of the IR light detected by the detector 97, the temperature of the wafer 2 is estimated on the basis of a boundary between the wavelength of the IR light absorbed by the wafer 2 and the wavelength of the IR light permeating the wafer.

Further, the plasma processing apparatus 100 of the embodiment includes configurations for detecting a film thickness on the wafer 2 above the top plate 6. Namely, an external light introducing unit 102 that irradiates, from above the discharge chamber 3, the surface of the wafer 2 arranged on the upper surface of the stage 4 in the processing chamber 1 with light from the outside and a light condensing unit 103 that receives light from the surface of the wafer 2 to be transmitted to the outside of the discharge chamber 3 are attached to the upper surface of the top plate 6. Further, the light condensing unit 103 includes a light condensing unit 103-1 that receives light irradiated from the external light introducing unit 102 and reflected from the upper surface of the wafer 2 and a light condensing unit 103-2 that receives light irradiated from any one of the IR lamps 62-1, 62-2, and 62-3 of the IR lamp unit and reflected from the upper surface of the wafer 2.

The external light introducing unit 102 is coupled to an external light source 101 through an optical fiber 92-3, and radiates light transmitted from the external light source 101 through the optical fiber 92-3 to the discharge chamber 3 through the through-hole of the top plate 6. The radiated light is irradiated on the middle part of the wafer 2 through the inside of the discharge chamber 3, a radical flow channel 78, the ion shielding plate 78, and the inside of the processing chamber 1 therebelow.

The light condensing unit 103-2 is arranged at a position located outside (circumferential side) the radial direction of the top plate 6 of the light condensing unit 103-1 on the top plate 6 or the discharge chamber 3, and receives light from the external light source 101 irradiated from the external light introducing unit 102 and reflected from the middle part of the upper surface of the wafer 2. One end of an optical fiber 92-4 transmitting the received light is connected to an upper part of the light condensing unit 103-2, and the received light transmitted in the optical fiber 92-4 is transmitted to a spectroscope 96-2 that is coupled to the other end of the optical fiber 92-4 and detects light separated for each of predetermined plural wavelengths.

As similar to the above, the light condensing unit 103-1 is arranged at a position located inside (central side) the radial direction of the top plate 6 of the light condensing unit 103-2 on the top plate 6 or the discharge chamber 3, and receives the IR light irradiated from any one of the IR lamps 62-1, 62-2, and 62-3 and reflected from the circumferential side part of the upper surface of the wafer 2. One end of an optical fiber 92-5 transmitting the received light is connected to an upper part of the light condensing unit 103-1, and the IR light to be transmitted is transmitted to a spectroscope 96-3 coupled to the other end and is detected by being separated for each of predetermined plural wavelengths. The light beams separated for plural wavelengths by the spectroscopes 96-2, 96-3, and 96-4 are transmitted to detectors 97-2, 97-3, and 97-4 connected thereto, and the intensity for each wavelength is detected.

It should be noted that the side wall of a vacuum conveyance container that is another vacuum container (not shown) and has a conveyance chamber that is decompressed space therein is coupled to the side wall of the base chamber 11 in the plasma processing apparatus 100 of the embodiment, and the processing chamber 1 and the vacuum conveyance chamber are communicated with each other through a gate configured by connecting a penetration passage that is arranged on the side wall having the cylindrical shape of the base chamber 11 surrounding the processing chamber 1 and the inside of which the wafer 2 passes through to a penetration passage arranged on the side wall of the vacuum conveyance container. A conveyance device such as a robot arm is arranged inside the conveyance chamber, and the wafer 2 placed and held on a holding unit located at a tip end of the arm is conveyed between the inside of the conveyance chamber and the inside of the processing chamber 1 by rotation and expansion and contraction of plural arms.

Further, the plasma processing apparatus 100 includes a controller 99 that controls operations of devices such as the high-frequency power supply 20, the matching device 22, the DC power supply 31, the regulating valve 14, the exhaust pump 31, the mass flow controller 50, the distributor 51, and the IR power supply for a lamp 64, operations such as opening/closing of a gate valve (not shown), and the magnitude of the output, and controls operations of the plasma processing apparatus 100 in such a manner that outputs of the thermocouple thermometer 71 and detectors 97-1, 97-2, 97-3, and 97-4 are received to calculate a result of detection indicated by the outputs and a command signal to adjust the operations of the power supply, the valve, and the pump to be suitable for a process on the basis of the result of detection is transmitted. The controller 99 calculates the remaining film thickness of a film to be processed on the upper surface of the wafer 2, to be described later, on the basis of the outputs of the detectors 97-1, 97-2, 97-3, and 97-4, and changes and adjusts conditions of a process such as the type of a gas to be introduced to the processing chamber 1 or the discharge chamber 3 of the plasma processing apparatus, the composition, and a pressure in the vacuum container.

Figure 2:
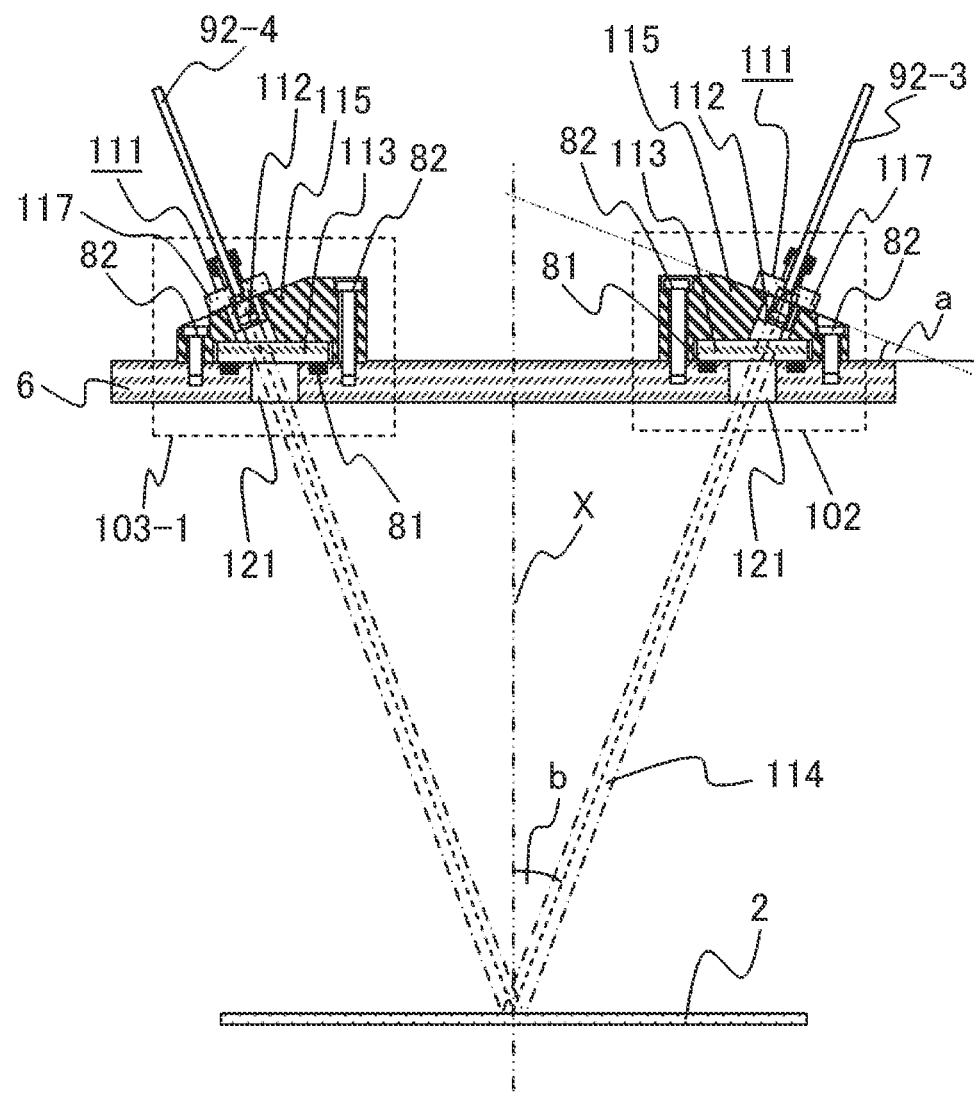
FIG. 2 is a vertical cross-sectional view for schematically showing configurations of an external light introducing unit and a light condensing unit of the plasma processing apparatus according to the embodiment shown in FIG. 1.

Next, details of a configuration for detecting the thickness of a film on the wafer 2 will be described using FIG. 2. FIG. 2 is a vertical cross-sectional view for schematically showing configurations of the external light introducing unit and the light condensing unit of the plasma processing apparatus according to the embodiment shown in FIG. 1.

As described above, in order to detect the film thickness of the surface of the middle part of the wafer 2, at least one external light introducing unit 102 is arranged at a predetermined position in the radial direction from the center above the top plate 6. The external light introducing unit 102 is attached to the top plate 6 using a screw 82 or a bolt in a state where the optical fiber 92-3 is inserted into and attached to the external light introducing unit 102.

The external light introducing unit 102 includes a quartz window 113 having a disk shape that is arranged at a predetermined radial position of the top plate 6 above a through-hole 121 having a predetermined radius penetrating the top plate 6 and a plunger 115 that is arranged above the quartz window 113 while covering the same and is fastened to the top plate 6 with at least one screw 82 to press the quartz window 113 from the above toward the upper surface of the top plate 6 located below. The plunger 115 includes an external part to which the optical fiber 92-3 is attached and that faces the atmosphere outside the vacuum container and a through-hole penetrating up to the lower surface having a recessed part into the inside of which the quartz window 113 is fitted while being attached to the top plate 6, and a collimating lens unit 111 is attached to the upper surface of the plunger 115 in accordance with the axis of the through-hole.

The collimating lens unit 111 includes a flange part 117 having a cylindrical or disk shape and a collimating lens 112 that protrudes to the lower side of the flange part 117 to be attached to the lower surface of the flange part 117 while the axis of the lens 112 matches a through-hole arranged in the middle of the flange part 117 and is configured using at least one convex or concave lens having a disk shape. The flange part 117 is fastened and attached to the upper surface of the plunger 115 using a screw or bolt. In the collimating lens unit 111, the flange part 117 is positioned and fixed to the upper surface of the plunger 115 in a state where the collimating lens 112 is inserted into the inside of the through-hole of the plunger 115.

The optical fiber 92-3 is positioned and fixed while being inserted into the through-hole of the flange part 117 so that the axis of the lower end of the optical fiber 92-3 matches the through-hole of the flange part 117, and is attached to the flange part 117 so as to extend upward from the upper surface of the flange part 117. In the embodiment, in a state where the collimating lens unit 111 is attached to the plunger 115, the central axis of the collimating lens 112 therein and the axis of the lower end of the optical fiber 92-3 are set perpendicular to the upper surface of the plunger 115 or at approximate angles that can be regarded to be perpendicular, and are positioned at positions that match the axis of the through-hole of the plunger 115 or at approximate positions that can be regarded to be matching.

In the external light introducing unit 102 of the example, the optical fiber 92-3 and the direction of the axis of light from a light source emitted from the lower end thereof are arranged in the collimating lens unit 111 and the plunger 115 so as to be inclined with respect to the upper surface of the wafer 2 by a predetermined angle toward the lower direction by permeating the discharge chamber 3 and the processing chamber 1 and the center part from the circumferential side of the wafer 2. Namely, the plunger 115 has a shape in which the upper surface thereof is inclined by only an angle a with respect to the top plate 6 or the lower surface of the plunger 115 connected to the top plate 6, and the direction of the axis of the lower end of the optical fiber 92-3 is inclined by the angle a with respect to the upper surface of the top plate 6 in the drawing in a state where the external light introducing unit 102 including the collimating lens unit 111 and the plunger 115 to which the collimating lens unit 111 is attached is attached to the top plate 6.

In addition, the upper surface of the top plate 6 is arranged parallel to the upper surface of the wafer 2, and the inclination a is set to a value equal to an angle b formed by the axis of light radiated from the optical fiber 92-3 and the lower end thereof and an axis X perpendicular to the upper surface of the wafer 2 or an approximate value that can be regarded as the angle b.

The quartz window 113 is pressed against the upper surface of the top plate 6 from the plunger 115 by the screw 82 in a state where an O-ring 81 is sandwiched between the quartz window 113 and the top plate 6, and the position of the quartz window 113 is fixed. The O-ring 81 is deformed by receiving pressing force from the plunger to hold an inner and outer airtight state.

It should be noted that external light 114 from the external light source 101 that is radiated from a lower end of the optical fiber 92-3 and is made parallel to the axis by the collimating lens 112 arranged by adjusting the focal point to the lower end of the optical fiber 92-3 passes through the inside of the plunger 115, the quartz window 113, the through-hole 121, and the discharge chamber 3, and is irradiated without being blocked until the external light 114 reaches the wafer 2 in the processing chamber 1. The external light 114 irradiated to the upper surface of the wafer 2 at the angle b with respect to the axis perpendicular to the upper surface is reflected by the upper surface and the lower surface of a film to be processed on the upper surface, passes through the processing chamber 1, the discharge chamber 3, and the through-hole 121 as interference light formed in such a manner that light beams reflected by plural surfaces interfere with each other by similarly forming the angle b with respect to the axis X perpendicular to the upper surface of the wafer 2, and is received by the light condensing unit 103-1 arranged on the upper surface of the top plate 6.

The light condensing unit 103-1 is arranged at a predetermined radial position of the top plate 6 symmetrical to the external light introducing unit 102 on the top plate 6 with respect to the axis X perpendicular to the upper surface at a predetermined position of the center part of the wafer 2. The configuration of the light condensing unit 103-1 of the embodiment is the same as that of the external light introducing unit 102, and includes a quartz window 113 having a disk shape that is arranged above the through-hole 121 of the top plate 6 and a plunger 115 that is arranged above the quartz window 113 and presses downward and holds the quartz window 113 by being fastened to the top plate 6 with at least one screw 82.

The plunger 115 has the same shape and configuration as that of the external light introducing unit 102, and the optical fiber 92-4 is attached to the upper surface thereof. The plunger 115 includes a through-hole penetrating up to the lower surface having a recessed part into the inside of which the quartz window 113 is fitted, and the collimating lens unit 111 is attached to the upper surface of the plunger 115 in accordance with the axis of the through-hole. The plunger 115 and the collimating lens unit 111 of the light condensing unit 103-1 are arranged to form an angle symmetrical to those of the external light introducing unit 102 on the drawing with respect to the axis X, and are attached to the upper surface of the plunger 115. Namely, the angle a formed by the upper surface of the plunger 115 of the light condensing unit 103-1 and the upper surface of the top plate 6 and the angle b formed by the axis of the collimating lens 112 and the optical fiber 92-4 and the axis X have the same values as those of the external light introducing unit 102, and are symmetrical with respect to the axis X.

As similar to the external light introducing unit 102, the quartz window 113 is pressed against the upper surface of the top plate 6 from the plunger 115 by the screw 82 in a state where an O-ring 81 is sandwiched between the quartz window 113 and the top plate 6, and the position of the quartz window 113 is fixed. The O-ring 81 is deformed so that airtight states inside and outside the discharge chamber 3 are sealed. Further, the position of the plunger 115 is fixed on the top plate 6, and the axis of the optical fiber 92-4 attached to the collimating lens unit 111 and the axis arranged by matching that of the collimating lens 112 are fixed by forming the angle a with respect to the top plate 6 and the angle b with respect to the axis perpendicular to the wafer 2, respectively.

The external light 114 for detecting a film thickness reflected by the upper surface of the wafer 2 permeates the ion shielding plate 78 (not shown) as interference light, and permeates the quartz window 113 of the light condensing unit 103-1 through the discharge chamber 3 and the through-hole 121. The collimating lens 112 includes at least one convex or concave lens having a disk shape, and the position thereof is adjusted in such a manner that the position of the focal point is adjusted to a lower end of the optical fiber 92-4. The external light 114 entering the quartz window 113 from the discharge chamber 3 is condensed at the lower end of the fiber 92-4 by the collimating lens 112, and is received at the lower end of the optical fiber 92-4. The external light 114 is irradiated onto the lower surface of the quartz window 113 without being blocked even in the optical path reaching the light condensing unit 103-1 from the upper surface of the wafer 2.

The light transmitting inside the optical fiber 92-3 from the external light source 101 reaches the external light introducing unit 102 located at a predetermined position in the radial direction of the top plate 6, and is radiated from a lower end of the optical fiber 92-3 to the upper surface of the top plate 6 at the predetermined angle a in the external light introducing unit 102. The direction of the light is changed to a direction parallel to the axis direction of the collimating lens 112 or an approximate direction that can be regarded to be parallel when the light permeates the collimating lens 112 in the external light introducing unit 102, and the light is radiated to the inside of the discharge chamber 3 through the window member 113 and the through-hole 121 as the external light 114.

The radiated external light 114 permeates a dispersion plate 17 and the ion shielding plate 78, and is irradiated onto a predetermined position of the upper surface of the center part of the wafer 2 in the processing chamber 1 at the angle b with respect to the axis line X perpendicular to the upper surface of the wafer 2. The external light 114 as interference light of both light beams reflected by the upper surface and the lower surface of the film layer to be processed on the surface of the wafer 2 permeates the ion shielding plate 78 and the dispersion plate 17 at the angle b with respect to the axis line X again, and enters the window member 113 of the light condensing unit 103-1 through the through-hole 121 of the top plate 6. The external light 114 entering the light condensing unit 103-1 in parallel with the advancing direction is received by and transmitted to the lower end of the optical fiber 92-4 after the advancing direction is changed so as to be concentrated when the external light 114 passes through the collimating lens 112 of the light condensing unit 103-1. After the external light 114 is divided for each of predetermined plural wavelengths in the spectroscope 96-2, the intensity of light having each wavelength is detected.

It should be noted that FIG. 2 schematically shows main parts of the configuration in which the external light 114 is irradiated onto a predetermined position of the middle part to detect the remaining film thickness of the center part of the wafer 2.

Figure 3:
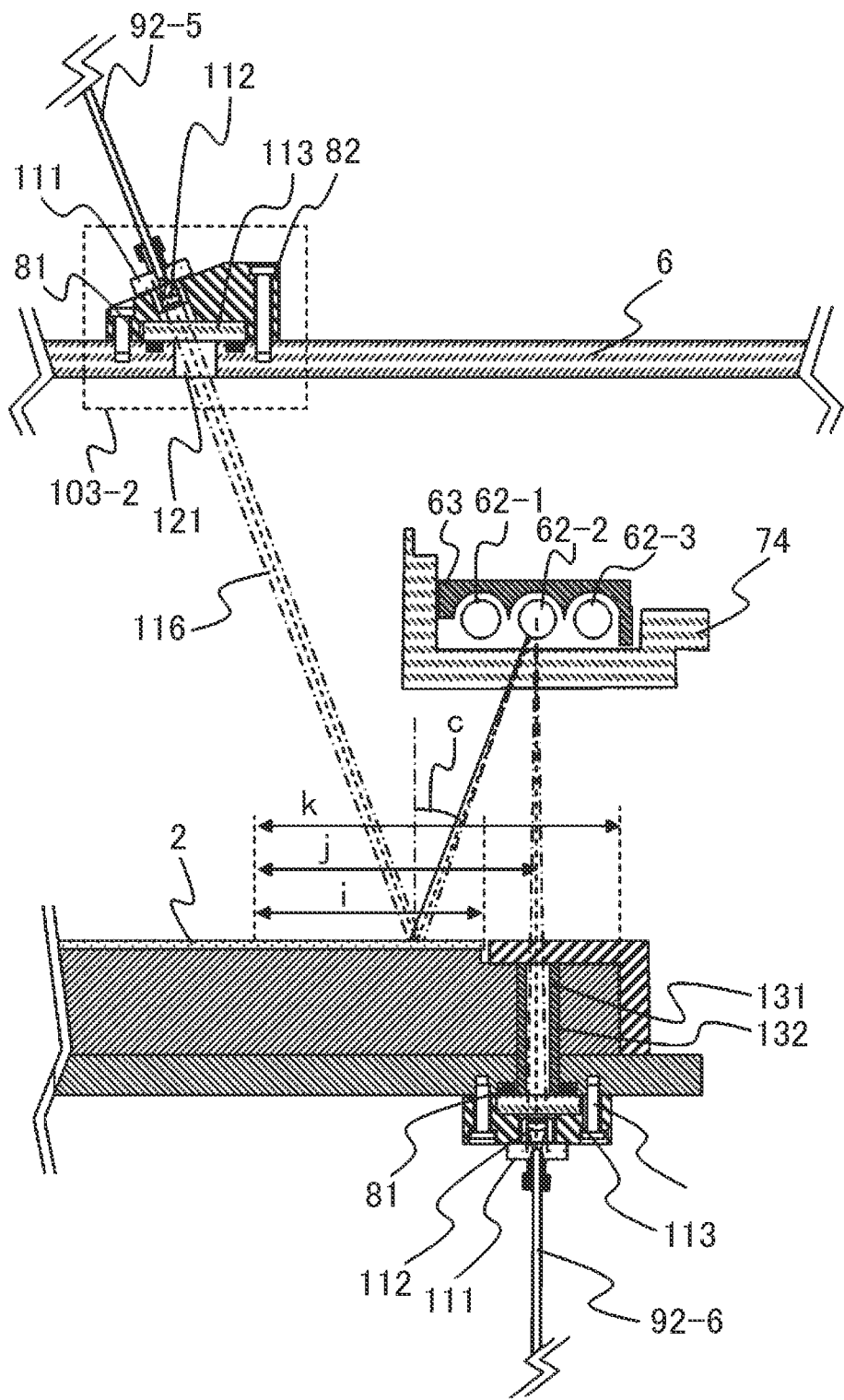
FIG. 3 is a vertical cross-sectional view for schematically showing an outline of a configuration in which the remaining film thickness of the circumferential part of a wafer is detected using light irradiated from the outside of a processing chamber in the plasma processing apparatus according to the embodiment shown in FIG. 1.

Next, a configuration in which the remaining film thickness of the circumferential part of the wafer 2 is detected in the embodiment will be described using FIG. 3. FIG. 3 is a vertical cross-sectional view for schematically showing an outline of a configuration in which the remaining film thickness of the circumferential part of the wafer is detected using light irradiated from the outside of the processing chamber in the plasma processing apparatus according to the embodiment shown in FIG. 1.

In the example, for the remaining film thickness of the part on the circumferential side of the wafer 2, IR light that is irradiated to heat the wafer 2 and is reflected by the part on the circumferential side is used. In the example shown in FIG. 3, IR light from the IR lamp 62-2 arranged at the intermediate position in the radial direction of the processing chamber 1 or the stage 4 among the IR lamps 62-1, 62-2, and 62-3 for heating the wafer 2 is used. As shown in the drawing, a position j in the radial direction where the IR lamp 62-2 of the example is arranged is arranged on the circumferential side with respect to a position i of the circumferential edge of the wafer 2 and on the central side with respect to a radius k of the circumferential edge of the base material of the stage 4 having a cylindrical or disk shape. By using this, the remaining film thickness is detected using the IR light radiated from the IR lamp 62-2.

In the example, the IR lamp unit is arranged in a ring shape on the same axis around the central axis in the vertical direction of the processing chamber 1 or the stage 4 above the processing chamber 1 or the stage 4, and in particular, the IR lamps 62-1, 62-2, and 62-3 and the IR light transmission window 74 are arranged to include the circumferential part of the stage 4 on the projection surfaces when viewed from the upper side. The IR lamp 62-2 irradiates the upper surface of the part on the circumferential side of the wafer 2 by radiating the IR light, and also irradiates a region on the circumferential side with respect to the wafer 2 of the stage 4. In the embodiment, the remaining film thickness of the upper surface of the part on the circumferential side of the wafer 2 is detected using the IR light reflected from the upper surface of the part on the circumferential side and the IR light irradiated on the region on the circumferential side of the wafer 2 of the stage 4.

In order to receive and detect IR light 116 reflected by the part on the circumferential side of the wafer 2, the light condensing unit 103-2 is arranged on the upper surface of the part on the circumferential side of the top plate 6. The structure of the light condensing unit 103-2 having the window member 113, the O-ring 81, the bolt 82, the plunger 115, the collimating lens unit 111, and the like and the configuration such as shapes and dimensions are the same as those of the light condensing unit 103-1. The IR light 116 received by the light condensing unit 103-2 is transmitted to the spectroscope 96-3 through the optical fiber 92-5 connected to the light condensing unit 103-2. It should be noted that the light condensing unit 103-2 is, as described above, arranged on the central side with respect to the light condensing unit 103-1 in the radial direction from the central axis in the vertical direction of the top plate 6, the discharge chamber 3, or the processing chamber 1.

In addition, an IR light detection hole 131 vertically penetrating the base material is arranged on the circumferential side of the mounting surface of the wafer 2 of the base material of the stage 4. The susceptor ring 8 made of ceramics such as quartz which the IR light permeates is arranged by covering the upper surface on the circumferential side of the mounting surface of the base material including an opening at an upper end of the IR light detection hole 131. The IR light detection hole 131 is arranged to have a direction and a dimension in which the IR light entering the inside of the opening at the upper end from the IR lamp 62-2 can straightly advance and emit from an outlet at a lower end.

A light condensing unit 103-3 is attached to the lower surface of the stage 4 by covering the opening at the upper end of the IR light detection hole 131 having a cylindrical shape. One end (upper end) of an optical fiber 92-6 is connected to the light condensing unit 103-3. The other end of the optical fiber 92-6 is connected to the spectroscope 96-4, and the IR light entering the inside of the IR light detection hole 131 and reaching the light condensing unit 103-3 is transmitted to the spectroscope 96-4 through the optical fiber 92-6.

As similar to the light condensing units 103-1 and 103-2, the light condensing unit 103-3 includes the window member 113, the plunger 115, the O-ring 81, the bolt 82, and the collimating lens unit 111, and the optical fiber 92-6 is connected to the collimating lens unit 111. The plunger 115 is attached to the lower surface of the stage 4 using the bolt 82 while sandwiching the O-ring 81 above the window member 113 between the plunger 115 and the window member 113, and seals the inside and outside tightly by pressing and deforming the O-ring 81.

The collimating lens 112 of the collimating lens unit 111 of the light condensing unit 103-3 and the optical fiber 92-6 arranged thereunder are attached to the lower surface of the stage 4 through the plunger 115 so that that the directions of the axes of the collimating lens 112 and the optical fiber 92-6 match or are set to the axis of the IR light detection hole 131, or are set to approximate directions that can be regarded to be matching or parallel. Namely, the optical path of the IR light from an upper end of the optical fiber 92-6 to the IR lamp 62-3 is configured without being blocked, and the axis direction in the vertical direction at the upper end of the optical fiber 92-6 matches the axis of the IR lamp 62-2 having a circular pipe shape through the IR light detection hole 131. In the example, the axes of the collimating lens 112 and the upper end of the optical fiber 92-6 are perpendicular to the lower surface of the stage 4 or the upper surface and the lower surface of the plunger 115.

In order to prevent the IR light radiated from another IR lamp 62-1 or 62-3 from entering the light condensing unit 103-3 and being condensed to the fiber 92-6, for example, a sleeve 132 obtained by applying treatment such as antireflection to black alumite treatment or the like is inserted into the inside of the IR light detection hole 131 to cover the inner wall.

The IR light 116 radiated from the IR lamp 62-2 is irradiated onto the upper surface at a predetermined position on the circumferential side of the wafer 2 at an angle c with respect to the axis line perpendicular to the upper surface of the wafer 2. The radiated IR light 116 is reflected by the upper surface and the lower surface of the film at the predetermined position at the angle c with respect to the axis line perpendicular to the upper surface of the wafer 2, and the IR light 116 as interference light (interference wave) formed in such a manner that both interfere with each other permeates the processing chamber 1, the ion shielding plate 78, and the dispersion plate 16 to reach the light condensing unit 103-2 through the through-hole 121.

The IR light 116 permeated after entering the window member 113 of the light condensing unit 103-2 is condensed and received at a lower end of the optical fiber 92-5 through the collimating lens 112. Further, the received IR light 116 is transmitted to the spectroscope 96-3 through the optical fiber 92-5, and is divided for each of predetermined plural wavelengths. Then, the intensity of light having each wavelength is detected.

In addition, the IR light 116 radiated downward from the IR lamp 62-2 permeates the susceptor ring 8 to penetrate after entering the inside of the IR light detection hole 131, and reaches the window member 113 of the light condensing unit 103-3 at a lower end of the IR light detection hole 131. The IR light 116 permeated after entering the window member 113 is condensed and received at an upper end of the optical fiber 92-6 through the collimating lens 112, and is further transmitted to the spectroscope 96-4 through the optical fiber 92-6 to be divided for each of predetermined plural wavelengths. Then, the intensity of light having each wavelength is detected.

Figure 4:
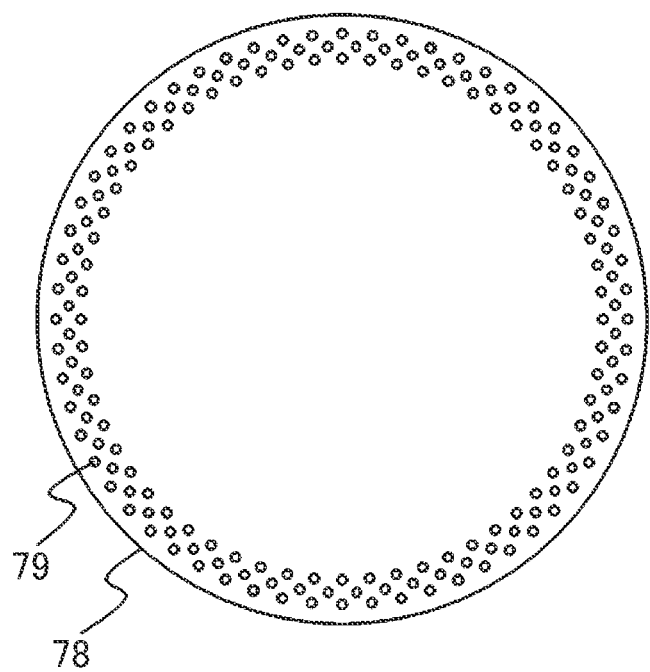
FIG. 4 is a top view for showing an outline of a configuration of an ion shielding plate used in the plasma processing apparatus according to the embodiment of FIG. 1.

A configuration of the ion shielding plate 78 of the embodiment will be described using FIG. 4. FIG. 4 is a top view for showing an outline of a configuration of an ion shielding plate used in the plasma processing apparatus according to the embodiment of FIG. 1.

In order to allow the external light 114 or the IR light 116 for detecting the remaining film thickness of the wafer 2 to permeate and to suppress reflection or refraction that deteriorates the accuracy of detection, the cross section of a position where these light beams permeate in the ion shielding plate 78 shown in the drawing has a flat disk shape. In order to prevent charged particles such as ions from passing through and to allow an active species such as radical formed in the discharge chamber 3 to pass through, the center part of the ion shielding plate 78 has a flat shape, and a gas hole 79 is arranged in a region on the circumferential side thereof to allow radical or gases in the ion shielding plate 78 to pass into a region in a predetermined range of values from the central axis to the radial direction. In addition, the ion shielding plate 78 is configured using ceramics as a material that has plasma resistance such as quartz and has translucency by which the external light 114 and the IR light 116 can permeate.

Next, a configuration of detecting the remaining film thickness of the upper surface of the wafer 2 using the IR light 116 detected through the IR light detection hole 131 arranged on the circumferential side of the mounting surface of the wafer 2 of the stage 4 in the embodiment will be described.

When the thickness of a film to be processed arranged on the upper surface of the wafer 2 is detected using light from the film during the process, light to be used is not desirably changed in wavelength dependency of the intensity of light radiated from the light source or the magnitude of the change is desirably as small as possible to detect with high accuracy. Therefore, the external light source 101 of the external light 114 irradiated onto the wafer 2 to detect the remaining film thickness of the center part of the wafer 2 in the embodiment needs to prevent the wavelength profile of the intensity of the radiated external light 114 from changing with the lapse of time or to suppress such a change.

Therefore, for example, a white LED lamp or a halogen lamp is used for the external light source 101 in the embodiment, and light or electromagnetic waves are radiated. In particular, a halogen lamp is changed in wavelength profile due to a change in temperature of the lamp itself. Thus, it is necessary to turn on the halogen lamp earlier by only predetermined time than the time when the detection of the remaining film thickness is started after starting the process of the wafer 2 and to stabilize the wavelength profile. In addition, it is not desirable to turn on and off the lamp in a short time or to repeat the same.

As similar to the above, the IR light radiated from the IR lamp 62 used to heat the wafer 2 is also changed in wavelength profile (color temperature) of the intensity of light in a predetermined period of time (for example, a few seconds) from the start of the radiation of the IR light of the energized IR lamp 62. Thus, in the case where the IR lamp 62 is used as a light source to detect the remaining film thickness, it is necessary to correct such a temporal change in wavelength profile.

Figure 9:
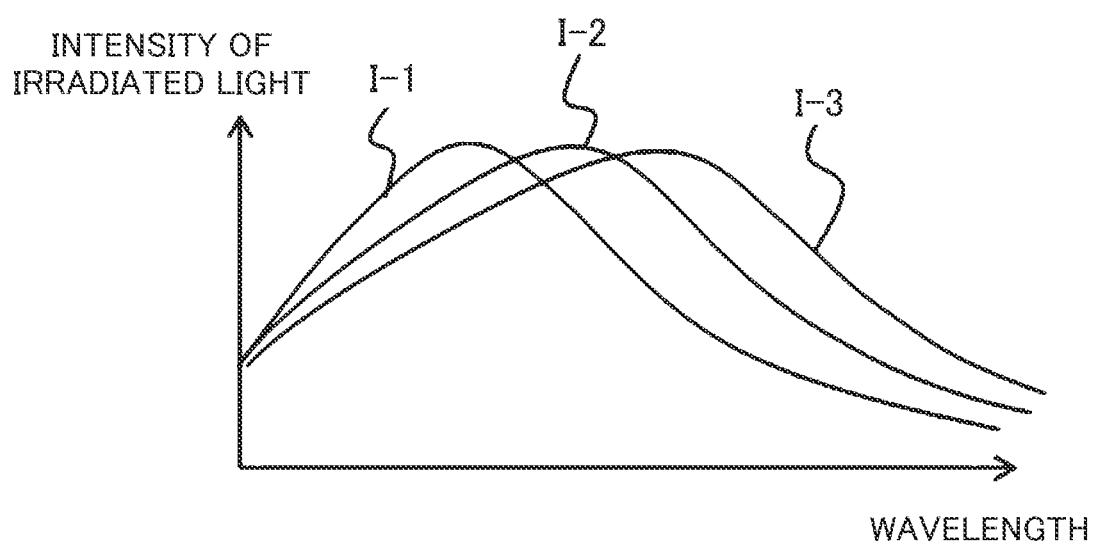
FIG. 9 is a graph for schematically showing changes due to the lapse of time or changes in temperature in wavelength profile of the intensity of light radiated from an external light source or an IR lamp used in the plasma processing apparatus according to the embodiment of FIG. 1.

An example of such a change in wavelength profile of the intensity of light will be described using FIG. 9. FIG. 9 is a graph for schematically showing changes due to the lapse of time or changes in temperature in wavelength profile of the intensity of light radiated from the external light source or the IR lamp used in the plasma processing apparatus according to the embodiment of FIG. 1.

As shown in the drawing, immediately after power is supplied to start to turn on the external light source 101 or the IR lamp 62 that is not energized and is in an OFF-state, the wavelength profile of the intensity of the light from the external light source 101 or the IR lamp 62 is changed such as I-3→I-2→I-3. On the contrary, in the case where power (current or voltage) to be supplied is low, the wavelength profile is changed such as I-1→I-2→I-3.

Accordingly, in the embodiment, as shown in the following equation (1) where the wavelength profile obtained from the intensity of light beams having plural wavelengths detected in the spectroscope 96-3 is F(λ) and the wavelength profile obtained in the spectroscope 96-4 is G(λ), $$F(\lambda)/G(\lambda) \tag{1}$$

instead of the intensity of light having each of plural wavelengths obtained from the spectroscope 96-3, the remaining film thickness is calculated using a value obtained by dividing the intensity of light having each wavelength by the intensity of light having each wavelength obtained in the spectroscope 96-4. The remaining film thickness is detected by correcting a change due to the lapse of time in wavelength profile of the intensity of the IR light from the IR lamp 62-2 using the equation (1), so that the remaining film thickness can be detected with high accuracy.

In addition, in the case where the angle b of FIG. 2 is the same as the angle c of FIG. 3, the wavelength profile of the light source 101 is measured and obtained in advance, and the remaining film thickness is estimated using the intensity ratio of light having each wavelength obtained by the same operation as the equation (1) using the wavelength profile as the standard, so that the remaining film thicknesses of the center part and a part on the circumferential side of the wafer 2 can be advantageously detected using data of the wavelength profile of the same standard.

Figure 5:
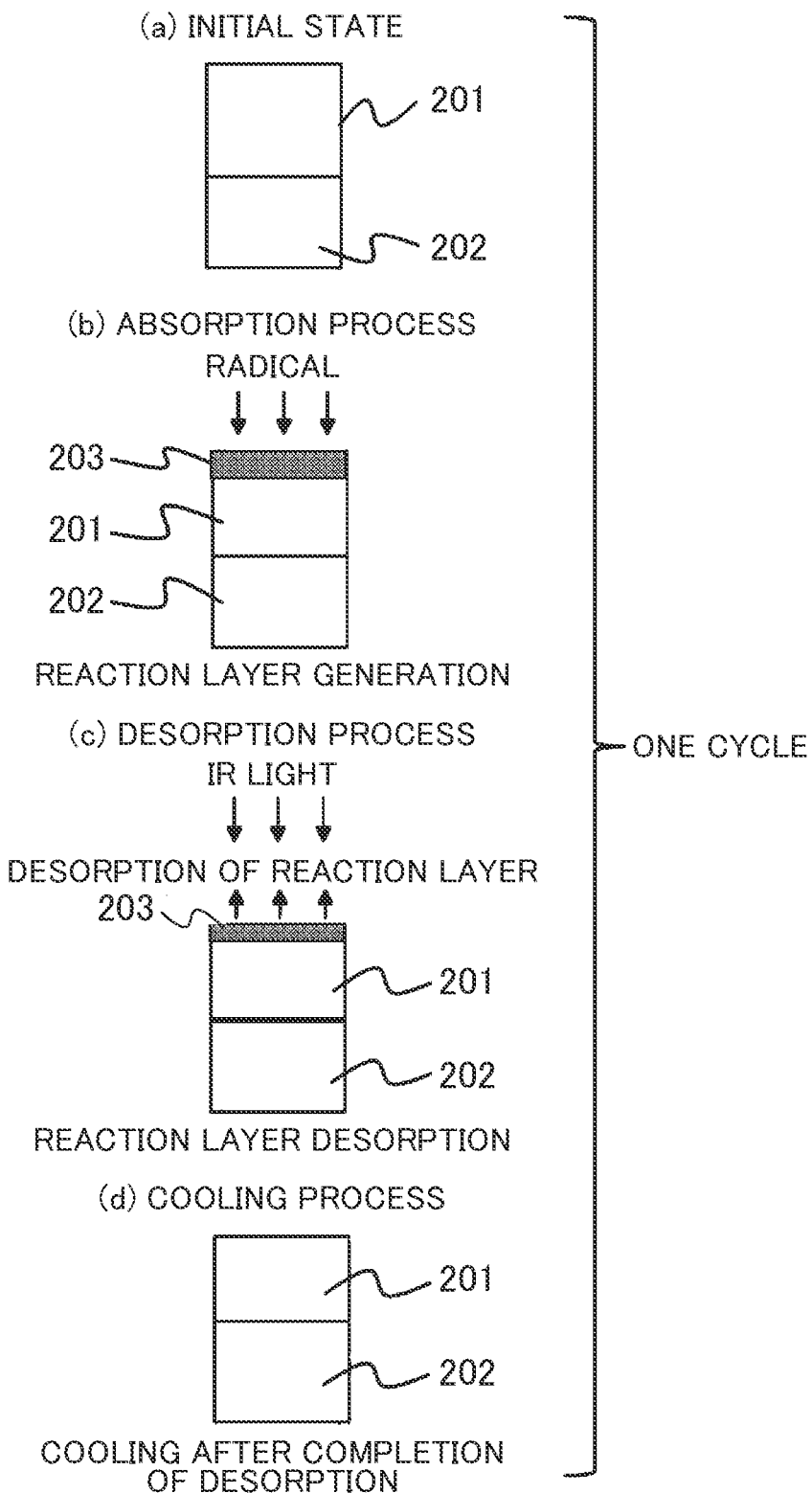
FIG. 5 is a diagram for schematically showing a flow of a process of a film to be processed of the upper surface of the wafer 2 performed by the plasma processing apparatus according to the embodiment shown in FIG. 1.
Figure 6:
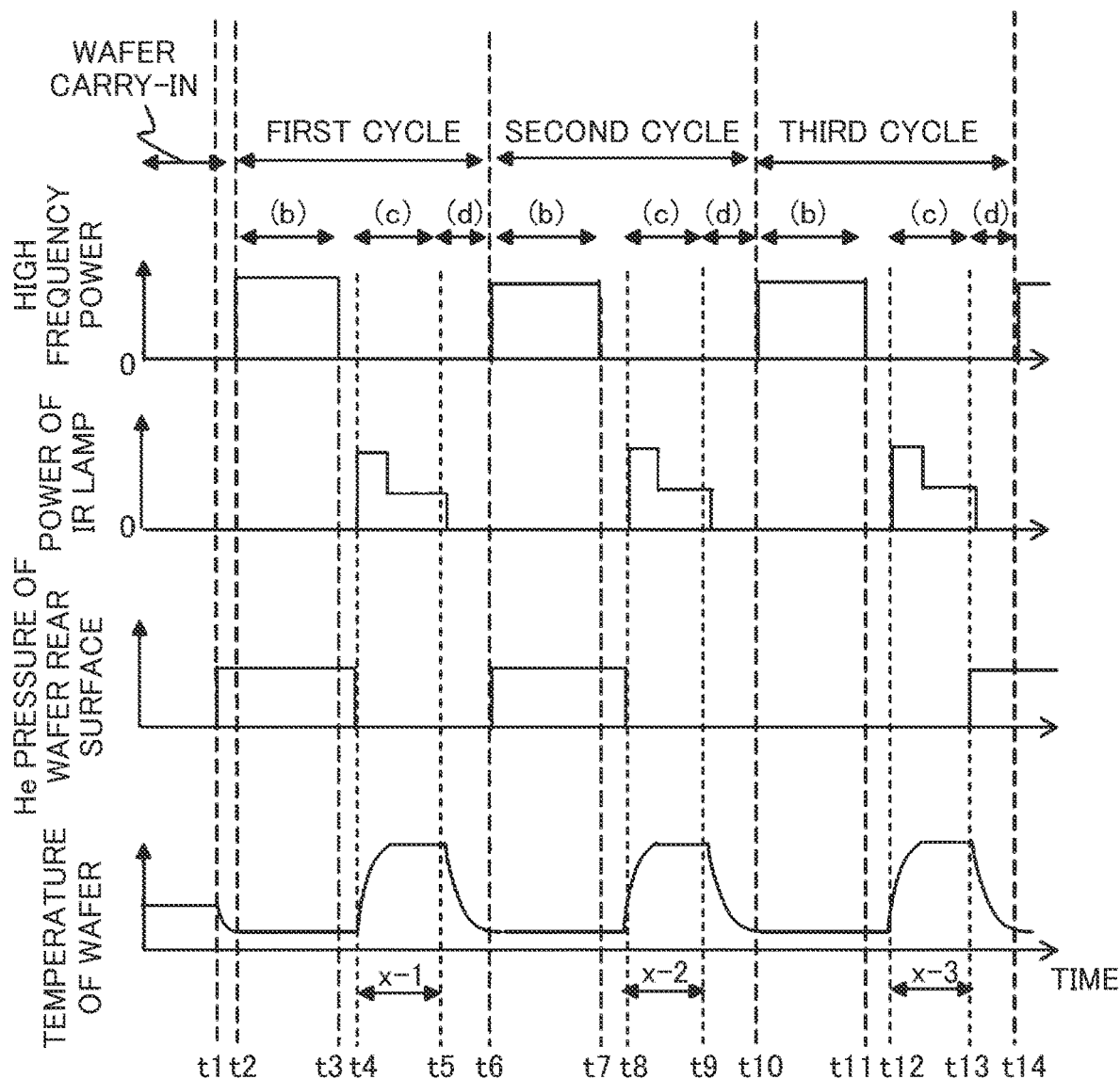
FIG. 6 is a time chart for schematically showing a flow of an operation of a process of the wafer performed by the plasma processing apparatus according to the embodiment shown in FIG. 1.

Next, a flow of a process of a film layer to be processed of the wafer 2 performed by the plasma processing apparatus 100 of the embodiment will be described using FIGS. 5, 6, and 8. Further, the timing the remaining film thickness is detected when the wafer 2 is processed will be described. FIG. 5 is a diagram for schematically showing a flow of a process of a film to be processed of the upper surface of the wafer 2 performed by the plasma processing apparatus 100 according to the embodiment shown in FIG. 1. In particular, the drawing schematically shows a structure of a film layer to be processed in plural processes of the process as a vertical cross-sectional view. FIG. 6 is a time chart for schematically showing a flow of an operation of a process of the wafer performed by the plasma processing apparatus according to the embodiment shown in FIG. 1.

The structure of films including a film to be processed of the upper surface of the wafer 2 of the embodiment has a configuration in which an etched layer 201 is laminated on an underlayer 202 as shown in FIG. 5. An initial state before starting the process is shown in FIG. 5(a).

An active species such as radical is supplied to the inside of the processing chamber 1 in a state where the wafer 2 on the upper surface of which such a film structure is formed in advance is held by the stage 4 in the processing chamber 1. The active species is absorbed on the surface of the etched layer 201 that is a film to be processed, and is reacted with a material configuring the etched layer 201 to generate a product and to form a reaction layer 203 (FIG. 5(b)). This process is referred to as an absorption process.

Next, the IR light 116 is irradiated onto the wafer 2 to heat the wafer 2, and the temperature is raised until the reaction layer 203 is sublimed and evaporated to remove the reaction layer 203 from the upper surface of the etched layer 201 (FIG. 5(c)). This process is referred to as a desorption process. Next, the irradiation of the IR light 116 onto the wafer 2 is stopped or reduced, and the temperature of the wafer 2 held on the stage 4 and the mounting surface thereof is reduced by heat exchange with a refrigerant circulating and flowing inside the flow channel 39 in the stage 4 (FIG. 5(d), cooling process).

By setting the processes from (b) to (c) or from (b) to (d) as one cycle, the cycle is repeated at least once or more until the etched layer 201 reaches a desired remaining film thickness in the embodiment. Namely, the thickness of the reaction layer 203 formed in the absorption process (b) becomes closer to a specific value because the reaction between the active species and the material of the etched layer 201 tends to be reduced along with an increase in the thickness of the reaction layer 203 and the ratio of the increase becomes small after the elapse of predetermined time. In the case where the specific value is less than a desired etching amount, the cycle is carried out plural times until the specific value reaches the etching amount.

A flow of a process of the wafer 2 in the plasma processing apparatus 100 of the embodiment will be described using FIG. 6. First, on the basis of a command signal from the controller 99, the wafer 2 passes through a gate (not shown) that is a through-hole arranged in the side wall of the cylindrical shape part of the base chamber 11 surrounding the processing chamber 1 and where the wafer 2 is carried in and out between the inside and outside of the processing chamber 1. The wafer 2 is carried into the processing chamber 1 by a robot arm to be transferred to the stage 4 and mounted on the mounting surface. Then, the wafer 2 is fixed onto the mounting surface of the stage 4 using electrostatic force formed by power supplied from the DC power supply 31 for electrostatic absorption. Further, a He gas for promoting heat transmission is supplied to the rear surface of the wafer 2 (Time t1).

Then, a processing gas adjusted to the distribution of compositions and a flow rate suitable for the process is introduced to the inside of the discharge chamber 3 through the shower plate 5 by operations of plural mass flow controllers 50, and is dispersed into the radial direction and the circumferential direction of the discharge chamber 3 at the dispersion plate 16 to be supplied. The atoms or molecules of the processing gas are ionized or dissociated by the induced magnetic field and the electric field generated by the ICP coil 34 to which power from the high-frequency power supply 20 is supplied, and the plasma 10 is formed in the discharge chamber 3 (Time t2).

Charged particles such as ions formed in the plasma 10 are prevented from being moved to the processing chamber 1 from the radical flow channel 75 by the ion shielding plate 78. On the other hand, an active species such as radical and a neutral gas pass through the gas hole 79 of the ion shielding plate 78 to be introduced into the processing chamber 1, and are irradiated onto the surface of the wafer 2 from the above.

The active species such as radical supplied to the inside of the processing chamber 1 in which the wafer 2 on the upper surface of which such a film structure is formed in advance is held by the stage 4 is absorbed on the surface of the etched layer 201 that is a film to be processed. The active species is reacted with a material configuring the etched layer 201 to generate a product, and the reaction layer 203 is formed ((b) absorption process). The etched layer 201 of the embodiment is configured using at least one kind of material among Si, $SiO_2$, SiN, SiGe, W, TiN, TiO, $Al_2O_3$, and the like.

When the reaction layer 203 is formed to have a predetermined film thickness after the elapse of predetermined time from the start of the absorption process, the supply of the high frequency power from the high-frequency power supply 20 is stopped, and the plasma 10 is extinguished (Time t3). Then, the supply of the He gas to a gap between the rear surface of the wafer 2 and the upper surface of the mounting surface of the stage 4 is stopped, and the valve 52 is released, so that the He gas in the supply passage of the He gas and in a gap between the wafer 2 and the stage 4 is released to the inside of the processing chamber 1. Accordingly, the pressure in a gap of the rear surface of the wafer 2 is set to substantially the same pressure of the inside of the processing chamber 1 (Time t4).

Further, power is supplied from the IR power supply for a lamp 64 to turn on the IR lamp 62, and the IR light radiated from the IR lamp 62 permeates the IR light transmission window 74 to be irradiated onto the wafer 2. Then, the heating of the wafer 2 is started, and the desorption process to desorb the reaction layer 203 is started. In the embodiment, when the thermocouple thermometer 71 having received an output from the thermocouple 70 detects the fact that the temperature of the wafer 2 has reached a predetermined value, the output of the IR power supply for a lamp 64 is reduced. While the temperature of the wafer 2 is maintained at a value within an allowable range on the basis of an output indicating the temperature detected by the thermocouple thermometer 71, the desorption process to desorb the reaction layer 203 is continued.

Thereafter, when the fact that predetermined time has elapsed from Time t4 is detected, the output from the IR power supply for a lamp 64 is stopped to reduce or stop the output of the IR lamp 62, and the heating of the wafer 2 is stopped. Further, an Ar gas with the flow rate adjusted is supplied to the inside of the processing chamber 1 by an operation of the mass flow controller 50, and a He gas is supplied to the rear surface of the wafer 2 to start a cooling process to cool the wafer 2 (Time t5). When the fact that the temperature of the wafer 2 has decreased to a predetermined value or lower is detected, it is determined that the cooling process is completed.

Reflected light beams of the external light 114 and the IR light 116 from the etched layer 201 irradiated onto the wafer 2 in the above-described desorption process or the cooling process are transmitted to the spectroscopes 96-2, 96-3, and 96-4 connected to the light condensing units 103-1, 103-2, and 103-3 through the optical fibers 92-4, 92-5, and 92-6, respectively, and data indicating the intensity of light beams having plural wavelengths detected by the detectors 97-2, 97-3, and 97-4 is transmitted to the controller 99 so that the controller 99 determines whether to have reached the value of the remaining film thickness of the etched layer 99 and the target value. When it is determined to have reached the target value, the etching of the wafer 2 is terminated, and the wafer 2 is conveyed out of the processing chamber 1 to the vacuum conveyance chamber. In the case where it is determined to have not reached the target value, the next cycle is started, the plasma 10 is formed in the discharge chamber 3 using the high frequency power from the high-frequency power supply 20 as the absorption process, and the active species such as radical is supplied again to the etched layer 201 on the surface of the wafer 2 (Time t6).

One processing cycle having the absorption process, the desorption process, and the cooling process is repeated in this order until the controller 99 determines that the etched layer 201 has reached the desired remaining film thickness, and the etching of the etched layer 201 is carried out (Time t6 to Time t14).

As described above, it is possible to increase the etching amount of the etched layer 201 by repeating one cycle having the absorption process, the desorption process, and the cooling process. In the case where variations in the thickness direction of the material of the etched layer 201 are within an allowable range and variations in the processing conditions of the absorption process and the desorption process are also within an allowable range, the controller 99 detects the remaining film thickness including the initial value of the reaction layer 203 in the desorption process and the removal of the reaction layer 203 at Time t5, t9, and t13. Then, the etching amount (remaining film thickness) when each cycle is terminated may be calculated on the basis of data indicating the correlation of an increase (decrease in the remaining film thickness) in the etching amount along with an increase in the number of cycles as shown in FIG. 7, and it may be determined whether to have reached the target value.

Figure 7:
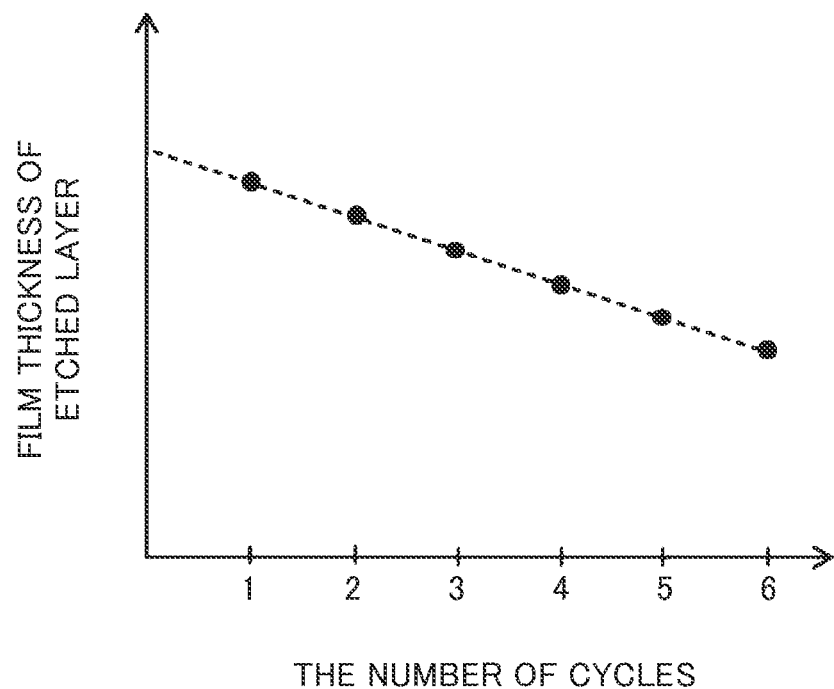
FIG. 7 is a graph for schematically showing a change in the remaining film thickness of an etched layer along with an increase in the number of cycles in the plasma processing apparatus according to the embodiment shown in FIG. 1.

FIG. 7 is a graph for schematically showing a change in the remaining film thickness of the etched layer along with an increase in the number of cycles in the plasma processing apparatus according to the embodiment shown in FIG. 1. In the drawing, the horizontal axis represents the number of cycles, the vertical axis represents the remaining film thickness of the etched layer 201, and a proportional relation of a linear function in which the remaining film thickness of the etched layer 201 is uniformly reduced in accordance with an increase in the number of cycles is shown.

The controller 99 storing such data indicating the correlation in a storage device may detect the removal of the reaction layer 201 in the desorption process, may calculate the number of cycles to determine to have reached the target removal amount of the etched layer 201 from the calculation result, and may carry the wafer out of the processing chamber by terminating the process without starting the next cycle.

It should be noted that a current is output from the DC power supply 31 to the electrostatic absorption electrode 30 to hold the wafer 2 on the mounting surface over the entirety of one cycle in the example, and the electrostatic absorption of the wafer 2 is continued. When the controller 99 detects to have reached the desired remaining film thickness and determines the termination of the etching of the etched layer 201, the electrostatic absorption by the DC power supply 31 is stopped, and the wafer 2 is desorbed from the stage 4 by removing static electricity if necessary to be carried out to the vacuum conveyance chamber.

In the above-described example, after the IR light 116 is irradiated onto the wafer 2 from the IR lamp 62 and the temperature of the wafer 2 is raised to a predetermined temperature by heating, and then degrees of the irradiation of the IR light 116, the heating of the wafer 2, and the temperature rise are adjusted so that the wafer is maintained in an allowable range. In periods x-1, x-2, and x-3 of the desorption process shown in FIG. 6, the film thicknesses of the etched layer 201 and the reaction layer 203 are detected using the external light 114 and the IR light 116. When the film thickness of the reaction layer 203 is detected in the desorption process and the controller 99 determines that the value is 0 or is sufficiently small so that it can be determined to move to the next process, the irradiation of the IR light onto the wafer 2 is stopped or reduced in accordance with a command signal from the controller 99, and the desorption process is terminated. In addition, the necessity of the next cycle may be determined by the controller 99 by detecting the film thickness of the etched layer 201 in the middle part of the wafer 2 using the external light 114 in the cooling process.

In addition, the film thickness of each of the etched layer 201 and the reaction layer 203 may be detected at each predetermined sampling time in the embodiment. In addition, a pattern (interference light pattern) indicating a correlation between the intensity and wavelength of light for the interference light beams having plural wavelengths of the external light 114 or the IR light 116 irradiated onto and reflected from the etched layer 201 and the reaction layer 203 at each sampling time may be detected to be compared with an interference light pattern for each remaining film thickness of each film having a film structure of the wafer 2 having the same configuration used as the preliminarily-obtained standard, so that the film thickness of the reaction layer 203 corresponding to the matching pattern or the film thickness of the etched layer may be detected as the film thickness at the sampling time during the process. Alternatively, in the case where the controller 99 detects that the magnitude of a change in the interference light pattern with the lapse of time is equal to or smaller than a predetermined threshold value, it may be determined that the removal of the reaction layer 201 is terminated (Time t5, t9, and t13), and the cooling process of the wafer 2 may be started.

Next, a modified example of a process of the wafer 2 will be described using FIG. 8. FIG. 8 is a time chart for showing a modified example of a flow of a process of the wafer according to the embodiment shown in FIG. 6. It should be noted that a difference from the example shown in FIG. 6 will be described in the modified example, and the description of the same signs and operations will be omitted if not necessary.

Figure 8:
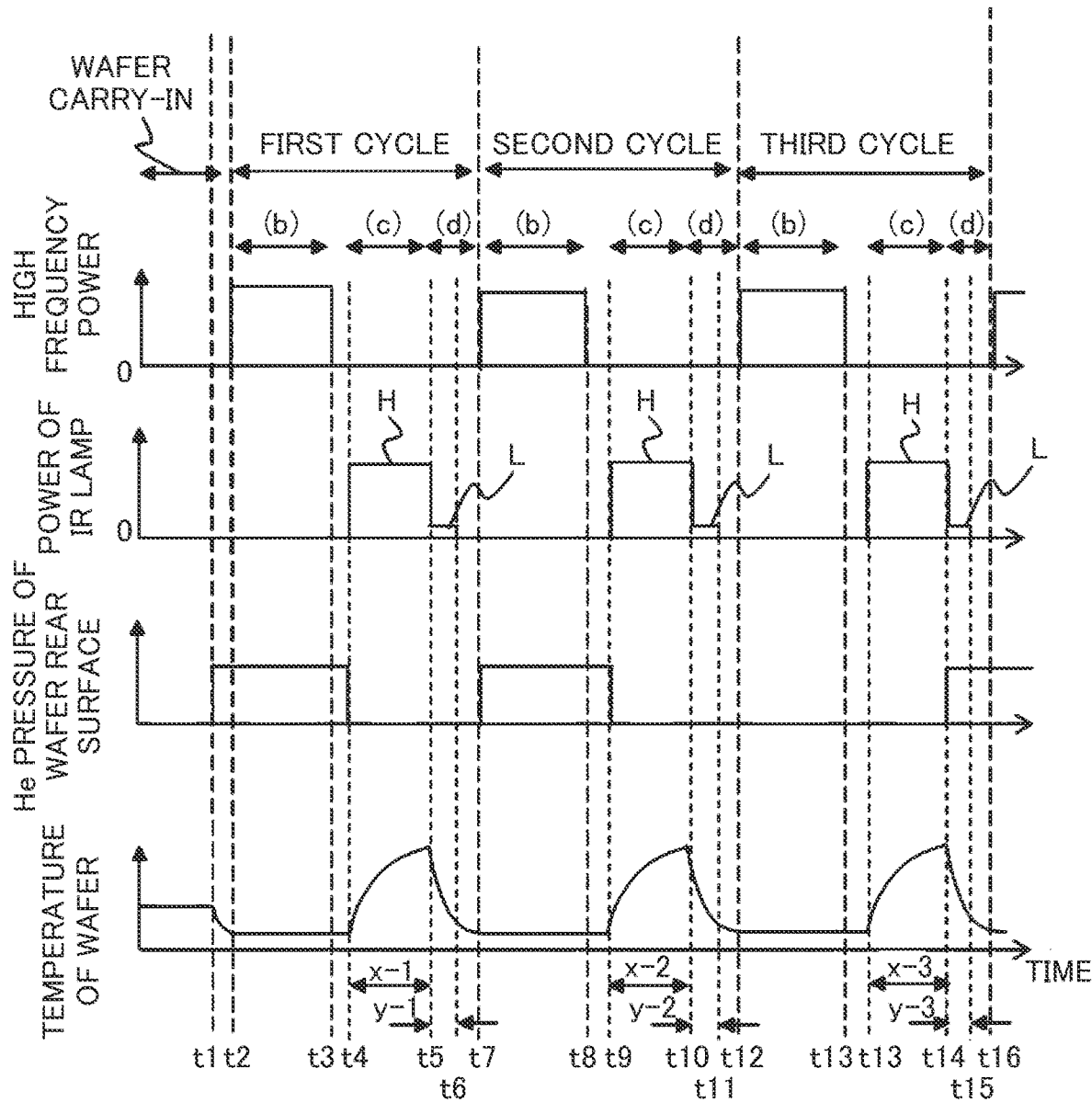
FIG. 8 is a time chart for showing a modified example of a flow of a process of the wafer according to the embodiment shown in FIG. 6.

FIG. 8 shows an example in which after the wafer 2 is heated by the IR lamp 62 so that the temperature thereof is raised to a predetermined temperature, the cooling of the wafer 2 is immediately started. The example is a preferable method in the case where the reaction layer 203 is desorbed and removed in a short time when the temperature of the wafer 2 is equal to or higher than a predetermined value. In this case, the remaining film thickness can be detected in a short time after the temperature of the wafer 2 reaches the maximum value. However, the remaining film thickness may be detected plural times at preliminarily-set intervals during the cooling of the wafer 2, and the remaining film thickness may be determined using the average value.

In the example, high power is supplied to turn on the IR lamps 62-1, 62-2, and 62-3 in only a predetermined period indicated by a sign H from Time t4 (t9 or t13) when the desorption period starts, so that the wafer 2 is rapidly heated. After the end of the period H, the supply of the power to the IR lamps 62-1 and 62-3 is stopped at Time t5 (t10 or t14), and the IR light 116 is irradiated in only a period indicated by a sign L at a low output by only the IR lamp 62-2 targeted by the light condensing unit 103-3 and the spectroscope 96-3 connected thereto. In the period L (Time t5 to t6, t10 to t11, and t14 to t15), the film thickness of the etched layer 201 is detected using the radiated IR light 116 (y-1, y-2, and y-3 in FIG. 8).

Then, when the detection of the film thickness is terminated, the power supplied to the IR lamp 62-2 is stopped. Then, in the case where the controller 99 determines that the remaining film thickness of the etched layer 201 has reached the target value, the etching process is terminated without starting the next cycle.

According to the above-described embodiment, when a film to be processed on the upper surface is etched by heating the wafer 2 with irradiated light from the lamp, the remaining film thickness of the upper surface of the wafer 2 can be detected with high accuracy by irradiating the wafer 2 with the irradiated light from the lamp or external light, and the yield can be improved by reducing variations in the shape of the surface of the wafer 2 as a processing result. In particular, in accordance with variations in the pattern of plural wavelengths of the intensity of light irradiated from the lamp according to the time or temperature of the irradiation, the remaining film thickness can be detected with high accuracy using a result obtained by detecting the irradiated light of the lamp at a position in the region on the circumferential side of the wafer 2 and using a result obtained by correcting the intensity of light irradiated onto and reflected from the upper surface of the wafer 2.

LIST OF REFERENCE SIGNS 1 processing chamber
2 wafer
3 discharge chamber
4 stage
5 gas dispersion component
6 top plate
7 gas hole
8 susceptor ring
10 plasma
11 base chamber
12 quartz chamber
14 pressure regulation valve
15 exhaust pump
16 vacuum exhaust pipe
17 gas dispersion plate
20 high-frequency power supply
22 matching device
24 DC power supply
25 filter
30 electrostatic absorption electrode
31 DC power supply
34 ICP coil
38 chiller
39 flow channel
50 mass flow controller
52 valve
62, 62-1, 62-2, 62-3 IR lamp
63 reflective plate
64-3 power supply for IR lamp
74 IR light transmission window
70 thermocouple
71 thermocouple thermometer
75 radical flow channel
78 ion shielding plate
79 gas hole
81 O-ring
82 screw
83 presser
84 fiber head
85 quartz rod
91 attachment hole
92 optical fiber
93 external IR light source
94 optical path switch
95 optical distributor
96, 96-1, 96-2, 96-3, 96-4 spectroscope
97-1, 97-2, 97-3, 97-4 detector
98 optical multiplexer
99 controller
101 external light source
102 external light introducing unit
103-1, 103-2 light condensing unit
111 collimating lens unit
112 collimating lens
113 window member
114 external light
115 plunger
116 IR light
131 IR light detection hole
132 sleeve
201 etched layer
202 underlayer
203 reaction layer

The invention claimed is:

1. A plasma processing apparatus comprising: a processing chamber provided inside a vacuum container; a sample table which is arranged in the processing chamber and which has an upper surface for holding a wafer, wherein a wafer processing is performed on the wafer; a plasma formation chamber which is arranged above the processing chamber inside the vacuum container and in which plasma is formed using a gas supplied therein; an introduction passage which communicates the plasma formation chamber with the processing chamber, inside of which reactive particles in the plasma pass through to be introduced to an inside of the processing chamber, and which has a lower opening above the upper surface of the sample table; a heater which is arranged on a circumferential region of the introduction passage surrounding the introduction passage above the processing chamber, and which irradiates the wafer with light or electromagnetic waves for a heating step of the wafer processing; an introduction plate which is arranged inside the introduction passage, and which has a plurality of through-holes through which the reactive particles pass in a circumferential portion of the introduction plate, and which has a middle portion surrounded by the circumferential portion with through-holes constituted by a material which the light or electromagnetic waves permeate; and a first detector which is arranged at an upper part of the plasma formation chamber and which detects a change in intensity of the light or electromagnetic waves which are emitted from the heater and are reflected by the wafer and permeate the middle portion of the introduction plate during the heating step of the wafer processing.

2. The plasma processing apparatus according to claim 1, further comprising:
   a second detector which is coupled to the sample table and is configured to receive and detect the intensity of the light or electromagnetic waves irradiated in a circumferential region of the sample table; and
   a controller configured to determine an end point of the wafer processing or a remaining film thickness of a film layer to be processed on an upper surface of the wafer based on a result of the detection performed by the first detector and a correction based on a result of the detection performed by the second detector.

3. The plasma processing apparatus according to claim 2, further comprising:
   a light emitter which is arranged at an upper part of the plasma formation chamber and which irradiates the upper surface of the wafer with the light or electromagnetic waves through the middle portion of the introduction plate; and
   a third detector which receives the irradiated light or electromagnetic waves reflected by the wafer and passing through the middle portion of the introduction plate to detect a temporal change in the intensity of the light or electromagnetic waves,
   wherein the controller is further configured to determine an end point of the wafer processing or the remaining film thickness of the film layer to be processed on the upper surface of the wafer based on a result detected by the third detector.

4. The plasma processing apparatus according to claim 3, wherein the third detector and the light emitter are arranged at a circumferential position of the first detector in a radial direction of the wafer in a plan view.

* * * * *